(12) United States Patent
Hammerschmidt et al.

(10) Patent No.: US 11,927,663 B2
(45) Date of Patent: Mar. 12, 2024

(54) IMPEDANCE STANDARD

(71) Applicant: Bayerische Motoren Werke Aktiengesellschaft, Munich (DE)

(72) Inventors: Thomas Hammerschmidt, Unterschleissheim (DE); Ulrich Roth, Kolbermoor (DE); Jan Philipp Schmidt, Holzmaden (DE); Martin Stanglmaier, Au in der Halltertau (DE); Christian Steinbauer, Zandt (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 101 days.

(21) Appl. No.: 17/594,067

(22) PCT Filed: Mar. 26, 2020

(86) PCT No.: PCT/EP2020/058538
§ 371 (c)(1),
(2) Date: Oct. 1, 2021

(87) PCT Pub. No.: WO2020/201007
PCT Pub. Date: Oct. 8, 2020

(65) Prior Publication Data
US 2022/0163613 A1  May 26, 2022

(30) Foreign Application Priority Data
Apr. 4, 2019 (DE) .................... 10 2019 108 920.4

(51) Int. Cl.
*G01R 35/00* (2006.01)
*G01R 31/389* (2019.01)
*G01R 31/396* (2019.01)

(52) U.S. Cl.
CPC ......... *G01R 35/007* (2013.01); *G01R 31/389* (2019.01); *G01R 31/396* (2019.01)

(58) Field of Classification Search
CPC ............... G01R 35/007; G01R 31/396; G01R 31/3648; G01R 31/389; G01R 31/006; G01R 31/378; Y02E 60/10
(Continued)

(56) References Cited

U.S. PATENT DOCUMENTS

| 2013/0143085 A1 | 6/2013 | Yoon |
| 2014/0184199 A1 | 7/2014 | Mueller et al. |
| 2017/0254859 A1* | 9/2017 | Christophersen .... G01R 31/382 |

FOREIGN PATENT DOCUMENTS

| DE | 100 65 644 A1 | 7/2002 |
| DE | 10 2011 078 334 A1 | 1/2013 |

(Continued)

OTHER PUBLICATIONS

International Search Report (PCT/ISA/210) issued in PCT Application No. PCT/EP2020/058538 dated Sep. 18, 2020 with English translation (four (4) pages).

(Continued)

*Primary Examiner* — Lee E Rodak
*Assistant Examiner* — Trung Q Nguyen
(74) *Attorney, Agent, or Firm* — Crowell & Moring LLP

(57) ABSTRACT

A calibration method includes (a) connecting a impedance measuring device to an impedance standard which has at least two excitation terminals for feeding an excitation signal and two measuring terminals for determining a measurement signal, and which has a fixed or adjustable impedance which corresponds to the impedance target; (b) applying a voltage signal to the excitation terminals and measuring the current flowing through the impedance standard due to the voltage signal at the measuring terminals; or supplying a current signal to the excitation terminals and measuring the dropping voltage at the measuring terminals; and (c) calibrating the impedance measuring device against (Continued)

Circuit board the impedance standard to the impedance target. The geometrical arrangement of terminals of the impedance standard corresponds to the geometrical arrangement of the terminals of the cell of which the impedance is to be measured.

11 Claims, 2 Drawing Sheets

(58) Field of Classification Search
USPC .................................................. 324/425–434
See application file for complete search history.

(56) References Cited

FOREIGN PATENT DOCUMENTS

| DE | 10 2014 011 397 A1 | 2/2016 |
|----|--------------------|--------|
| KR | 10-2013-0061376 A  | 6/2013 |

OTHER PUBLICATIONS

German-language Written Opinion (PCT/ISA/237) issued in PCT Application No. PCT/EP2020/058538 dated Sep. 18, 2020 (five (5) pages).

German-language Search Report issued in German Application No. 10 2019 108 920.4 dated Feb. 20, 2020 with partial English translation (17 pages).

Gamry Instruments: EIS Measurement of a Very Low Impedance Lithium Ion Battery—Application Note. Warminster, PA, USA, 2007. S.1-6.—Firmenschrift. URL: https://www.gamry.com/application-notes/EIS/eis-measurement-of-a-very-low-impedance-lithium-ion-battery/[abgerufen am 20.02.2020] (six (6) pages).

Korean-language Office Action issued in Korean Application No. 10-2021-7028433 dated Aug. 17, 2023 with English translation (10 pages).

* cited by examiner

Circuit board

IMPEDANCE STANDARD

BACKGROUND AND SUMMARY OF THE INVENTION

The present invention relates to a method for calibrating an impedance measuring device for galvanic cells using an impedance normal, and to a corresponding impedance normal.

Electrochemical impedance spectroscopy (EIS) is an established method for characterizing electrochemical systems, such as in particular also galvanic cells. The prior art also teaches the practice of using impedance measurements to diagnose the state of lithium ion cells in the automotive sector.

It is possible to measure the impedance by applying a predetermined AC voltage signal U(t) to the cell and measuring the resulting AC current I(t), or by supplying a predetermined AC current signal I(t) and measuring the resultant AC voltage U(t) dropped across the cell. The impedance Z is generally complex and in both cases is obtained as $Z=U(t)/I(t)$.

What are known as impedance normals can be used to calibrate the measuring device. An impedance normal ultimately behaves outwardly like a precision resistor with a precisely defined, previously known impedance, also referred to as impedance setpoint value $Z_{Soll}$ below.

In contrast, internally these are typically active components that generate a corresponding output signal I(t) or U(t) from the applied input signal (U(t) or I(t)), such that the equation $Z_{Soll}=U(t)/I(t)$ is satisfied.

The use of impedance normals has already been discussed in the literature ("A Nonlinear Impedance Normal", 2012, Nordmann et al.) and the implementation as a circuit is described in DE 10 2014 011 397 A1, for example.

The impedance normal from DE 10 2014 011 397 A1 specifically comprises an AC current measuring resistor at at most 0.2 ohm and a conversion apparatus that generates the actual output voltage from the operating voltage dropped across the AC current measuring resistor. The conversion apparatus can be implemented using analog technology, for example, by using two negative-feedback operational amplifiers. The impedance setpoint value can be set at the first operational amplifier by changing the negative-feedback resistance, for example. An embodiment using digital technology is also described. In this case, the voltage signal dropped across the AC current measuring resistor is preamplified and taken via an A/D converter to a digital signal processor (DSP) that then calculates the output signal on the basis of the digitally predefined setpoint impedance and outputs it via a subsequent D/A converter.

In this prior art, the focus in each case is on the implementation of the impedance normal as a circuit. The connection of the impedance normals to the measuring device is not described in more detail and in practice is realized by way of banana plugs, or the like.

In the case of low-impedance test units (as is the case for battery cells in motor vehicles), merely a difference in the arrangement of the wiring generally leads to different measurement results for frequencies above 10 Hz. The calibration using an impedance normal of arbitrary geometric design therefore leads to results that are dependent on the cable routing or the position of the connections. An impedance normal of this kind consequently cannot be used to calibrate test benches for test units with low impedances.

Achievement of the Object

With regard to the above problem, the proposal according to the invention is to design the impedance normal in such a way that at least the connections of the impedance normal match those of the cell to be measured. The impedance normal can thus be connected to the measuring device in the same arrangement as the cell, and the dependence on the wiring can be reduced or eliminated.

Calibrating the test bench therefore also comprises routing the cables and holding the cells. Impedance measurement data above 10 Hz can thus be used for further evaluation. As a result of the calibration, a correction function can then also be derived to factor out the components from the wiring and to be able to meaningfully evaluate an extended frequency range of 10 Hz to at least 100 kHz.

It is furthermore possible to render different test benches comparable. The measurement results on different test benches can then also be quantitively compared for frequencies >10 Hz.

DETAILED DESCRIPTION OF THE DRAWINGS

Impedance Measuring Device

Figure 1:
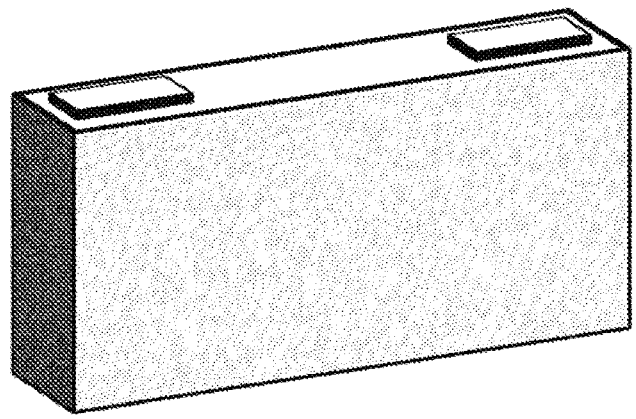
FIG. 1 shows the outline of a lithium ion cell in the form factor PHEV-1 with plate-shaped connection contacts.

The method according to an embodiment of the invention can be used for any desired impedance measuring devices that are provided for impedance measurement or impedance spectroscopy examination (EIS) of galvanic cells, in particular lithium ion cells. For example, these can be a test bench measuring device or a measuring device that is permanently installed in an electrically operated vehicle for online diagnosis.

The measuring device has at least one output for the excitation signal (source) and one input for the measurement signal (sense), which in turn each comprise two connections (source+ and source−, and sense+ and sense−). In principle, the source signal can be a voltage signal or a current signal; accordingly the sense signal is a current signal or a voltage signal. A current signal is preferably used as source signal (galvanostatic measurement).

The measurement frequency is not specifically restricted and can be 5 Hz to 100 kHz, for example.

The contact connection section in which the measuring device is connected up to the cell can be configured as a retaining apparatus into which the entire cell can be introduced, for example can be clamped. The source connections and sense connections of the measuring device can then be connected to the connections of the cell via contact elements correspondingly provided in the retaining apparatus.

Alternatively, the measuring device can be configured in such a way that it has a socket element that can be plugged onto the cell, or it can be plugged onto the cell as a whole, to make the connection.

In a further embodiment, the measuring device can also be permanently installed in an electrically operated vehicle or in a battery pack, to allow calibration and validation of the measuring device for an online impedance measurement during operation, for example.

When the measuring device is intended to be calibrated using the method according to an embodiment of the invention, the impedance normal described below is used instead of the cell and is contact-connected to the measuring device in the same way. In a full store, a single can also be replaced by an impedance normal to monitor the correct functioning of the impedance measuring device during operation.

Contact Arrangement of the Impedance Normal

The impedance normal used according to an embodiment of the invention has at least two excitation connections (A1, A2) for feeding in the source signal and two measurement connections (M1, M2) for determining a measurement signal. According to an embodiment of the invention, the geometric arrangement of these connections corresponds to that of the connections of the cell for which the impedance is intended to be measured, as a result of which the impedance normal can be contact-connected to the impedance measuring device in the same arrangement as the cell.

If the impedance measuring device is provided for cells with a standardized form factor, for example prismatic cells of the PHEV1 or PHEV2 type, and the connection positions are also stipulated for the form factor, then the connections of the impedance normal correspond to the connection position as specified in the applicable standard.

In one embodiment, the cell that is intended to be measured can already be configured for four-point contact connection and accordingly have two anode and cathode connections, of which in each case one is provided for measuring the voltage. In this case, the contact surfaces of the connections of the impedance normal are arranged in such a way that they match the connection arrangement of the cell.

Alternatively, the cell has only one anode connection and one cathode connection. In the corresponding impedance normal, the contact surfaces of the connections A1 and E1 are then arranged in such a way that together they match the contact surface of the anode connection of the cell. The same also applies to the connections A2 and E2 for the cathode connection.

Figure 2:
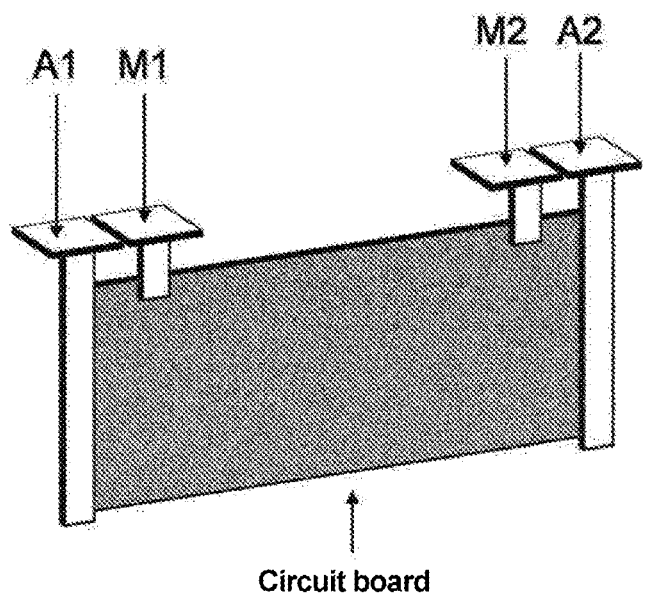
FIG. 2 is a sketch of the impedance normal that can be used according to an embodiment of the invention, which has the same format as the cell shown in FIG. 1 and the split connections A1/M1 and M2/A1 of which match the connection contacts of the cell. The actual circuit of the impedance normal is implemented on the circuit board.

If, for example, the connections of the cell are plate-shaped, as shown in FIG. 1 using the example of a PHEV-1 cell, the connections of the impedance normal can be arranged in split fashion next to one another in each case, for example with source contact surfaces A1 and A2 on the outside and sense contact surfaces M1 and M2 on the inside, as shown in FIG. 2.

Figure 3:
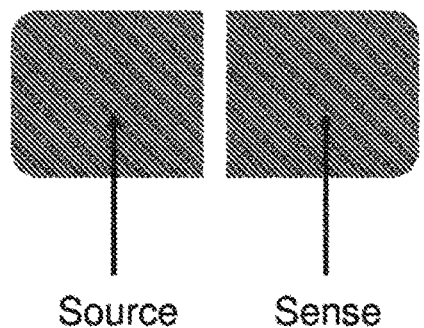
FIG. 3 shows an embodiment of the contacts of the impedance normal according to the invention in which the source connection (A1 and A2) and the sense connection (M1 and M2) are situated next to one another.

FIG. 3 shows the arrangement of A1 (source) and M1 (sense) in plan view. An air gap or an insulating separating element is typically located between A1 and M1 for electrical insulation. The arrangement is correspondingly mirrored for the other side (i.e. A2 and M2).

Figure 4:
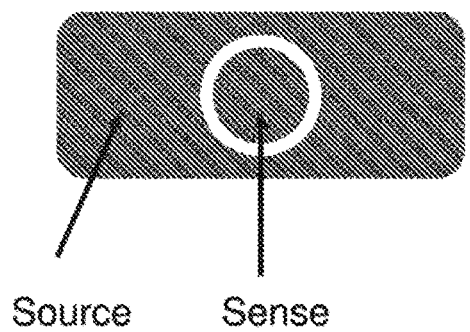
FIG. 4 shows a further embodiment in which the sense connection (M1, M2) is inside and is completely surrounded by the contact surface of the source connection (A1, A2).

Alternatively, the contact surfaces of the connections A1 and A2 can at least partly surround the contact surfaces of the connections E1 and E2. FIG. 4 shows a (coaxial) arrangement of this type in which the sense contact E1/E2 is surrounded by the source contact A1/A2 as a kind of island, wherein the contact surfaces are again delimited from one another by a gap or insulation.

Figure 5:
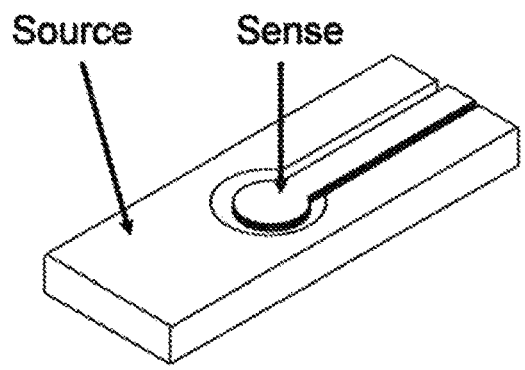
FIG. 5 shows a further embodiment in which the sense connection has been introduced as an inlay into a channel milled into the contact plate of the source connection. The sense contact is electrically insulated with respect to the source contact, at least toward the bottom. Furthermore, the contact surface of the sense contact can be offset downward, for example by approximately 1 mm, with respect to that of the source contact.

In a further embodiment, the sense contact E1 can have been introduced as an inlay into the contact surface of A1. An arrangement of this type is shown in FIG. 5. In this case, a channel-like recess has been milled into a plate-shaped contact element acting as the source connection A1. The contact element serving as the sense connection E1 has been introduced as an inlay into this recess. An electrical insulation is provided between the two contact elements. The contact surface of the inlay can preferably be situated somewhat deeper, for example by approximately 1 mm, than the contact surface of the plate-shaped contact element.

Outer Shape of the Impedance Normal

According to an embodiment of the invention, at least the geometry and the spatial arrangement of the connections A1/A2/E1/E2 of the impedance normal correspond to those of the cell. The outer shape of the impedance normal is not specifically restricted as long as the measuring device can be contact-connected to the impedance normal in the same way as the cell.

In a preferred embodiment, the other dimensions of the impedance normal also correspond to those of the cell for which the impedance is intended to be measured, as a result of which the impedance normal can be introduced into the measuring device in the same way as the cell.

If the measuring device is provided for PHEV1 cells, for example, the dimensions of the impedance normal preferably correspond to those of a PHEV1 cell, as shown in FIGS. 1 and 2. In one particularly preferred embodiment, the impedance normal can also have a housing that complies with the PHEV1 standard.

It goes without saying that the same also applies to any other form factors, for example PHEV2, BEV1 or BEV2 (according to VDA).

Internal Structure and Operation of the Impedance Normal

The impedance of the impedance normal is typically low and is in the region of the impedance to be expected for the cell, for example in the region of 1 mohm or less, typically 0.5 mohm or less.

The internal structure of the impedance normal is not specifically restricted and all known designs can be used. In particular, the designs described in DE 10 2014 011 397 A1 also come into consideration.

The impedance normal can have a single preset impedance. If a plurality of calibration points are to be recorded, it is necessary to use a plurality of impedance normals with different impedances that are exchanged accordingly.

Alternatively, the impedance normal can have a plurality of variable impedances that can be selected by switching over a resistor, for example. If the impedance normal is configured using digital technology and the output signal is generated by a signal processor (DSP), the impedance can be set by appropriate programming of the DSP. In particular, in this case, both the magnitude and the phase shift of the output signal can be selected freely, and so this embodiment is preferred in view of the flexibility for the selection of the calibration points.

In one particularly preferred embodiment, the impedance normal has additional control connections for setting the impedance value $Z_{Soll}$ and/or for reading the set value. These can be connected to the measuring device via an appropriate control interface such that the setting of the setpoint value, the calibration and optionally the repetition for further calibration points can be performed in an automated manner.

To this end, an appropriate calibration program that comprises a plurality of measurement points for different impedance setpoint values and/or different frequencies can be stored in the measuring device. The measurement points can then be swept through in an automated manner, wherein the impedance measuring device sets the applicable reference setpoint values of the impedance normal under program control via the control interface.

What is claimed is:

1. A calibration method for an electrochemical impedance measuring device that is provided for measuring an impedance of an electrochemical cell, the method comprising:
   (a) connecting the impedance measuring device to an impedance normal that has at least two excitation connections for feeding in an excitation signal and two measurement connections for determining a measurement signal, and that has a fixed or variable impedance that corresponds to an impedance setpoint value $Z_{Soll}$;
   (b) applying a voltage signal $U_{Ein}$ to the excitation connections and measuring the current $I_{Aus}$ flowing through the impedance normal on account of the voltage signal $U_{Ein}$ at the measurement connections; or supplying a current signal $I_{Ein}$ to the excitation connections and measuring the voltage drop $U_{Aus}$ at the measurement connections; and
   (c) calibrating the impedance measuring device against the impedance normal to the impedance $Z_{Soll}$ using $Z=U_{Ein}/I_{Aus}=Z_{Soll}$ or $Z=U_{Aus}/I_{Ein}=Z_{Soll}$,
   wherein a geometric arrangement of the excitation connections and the measurement connections of the impedance normal corresponds to a geometric arrangement of connections of the electrochemical cell for which the impedance is to be measured, as a result of which the impedance normal can be contact-connected to the impedance measuring device in a same arrangement as the electrochemical cell.

2. The method according to claim 1, wherein the electrochemical cell is a lithium ion cell.

3. The method according to claim 1, wherein the electrochemical cell has one anode connection and one cathode connection, and an arrangement of contact surfaces of a first connection and a second connection of the impedance normal for the anode connection, and a first connection and a second connection of the impedance normal for the cathode connection, combined matches an arrangement of contact surfaces of the anode connection and the cathode connection.

4. The method according to claim 3, wherein the contact surfaces of the first and second connections of the impedance normal for the anode connection, and the first and second connections of the impedance normal for the cathode connection, are arranged next to one another in each case.

5. The method according to claim 3, wherein the contact surfaces of the first connection of the impedance normal for the anode connection and the first connection of the impedance normal for the cathode connection at least partly surround the contact surfaces of the second connection of the impedance normal for the anode connection and the second connection of the impedance normal for the cathode connection.

6. The method according to claim 5, wherein the first connection of the impedance normal for the anode connection and the first connection of the impedance normal for the cathode connection are shaped as plates, and the second connection of the impedance normal for the anode connection and the second connection of the impedance normal for the cathode connection are formed as inlays on a contact side of the plates.

7. The method according to claim 1, wherein the electrochemical cell is provided for four-point contact connection and has two anode and two cathode connections, and the arrangement of the connections of the impedance normal matches an arrangement of the anode and cathode connections of the electrochemical cell.

8. The method according to claim 1, wherein (b) to (d) are repeated for at least one of a plurality of different impedance values $Z_{Soll}$ or a plurality of different excitation signals.

9. The method according to claim 1, wherein the impedance normal has additional control connections for at least one of setting the impedance $Z_{Soll}$ or reading a set value.

10. An impedance normal that is configured to be used in the method according to claim 1.

11. The impedance normal according to claim 10, wherein the geometric arrangement complies with a PHEV1, PHEV2, BEV1 or BEV2 form factor.

* * * * *